United States Patent
Hartmann et al.

(10) Patent No.: US 10,062,858 B2
(45) Date of Patent: Aug. 28, 2018

(54) METHOD FOR MANUFACTURING AN ORGANIC ELECTRONIC DEVICE

(75) Inventors: Sören Hartmann, Baesweiler (DE); Herbert Lifka, Son (NL)

(73) Assignee: OLEDWORKS, LLC, Rochester, NY (US)

( * ) Notice: Subject to any disclaimer, the term of this patent is extended or adjusted under 35 U.S.C. 154(b) by 15 days.

(21) Appl. No.: 13/877,684

(22) PCT Filed: Oct. 6, 2011

(86) PCT No.: PCT/IB2011/054404
§ 371 (c)(1),
(2), (4) Date: Apr. 4, 2013

(87) PCT Pub. No.: WO2012/049593
PCT Pub. Date: Apr. 19, 2012

(65) Prior Publication Data
US 2013/0210177 A1   Aug. 15, 2013

(30) Foreign Application Priority Data
Oct. 12, 2010   (EP) .................................. 10187218

(51) Int. Cl.
*H01L 21/00* (2006.01)
*H01L 51/10* (2006.01)
(Continued)

(52) U.S. Cl.
CPC ........ *H01L 51/107* (2013.01); *H01L 51/0017* (2013.01); *H01L 51/448* (2013.01);
(Continued)

(58) Field of Classification Search
CPC . H01L 51/0017; H01L 51/107; H01L 51/448; H01L 51/5237; H01L 27/3276;
(Continued)

(56) References Cited

U.S. PATENT DOCUMENTS 5,953,585 A   9/1999  Miyaguchi
7,332,263 B2  2/2008  Addington et al.
(Continued)

FOREIGN PATENT DOCUMENTS

JP   11-312583 A   11/1999
JP   2001110566 A   4/2001
(Continued)

OTHER PUBLICATIONS

Florian Pschenitzka; "Patterning Techniques for Polymer Light-Emitting Diodes", Thesis Submitted to Dept. of Elect. Engg., Princeton Univ., USA, Jun. 2002, pp. 145-164.
(Continued)

*Primary Examiner* — Charles Garber
*Assistant Examiner* — Abdulfattah Mustapha

(57) ABSTRACT

The invention relates to method for manufacturing an electronic device comprising an organic layer (120). According to this method, a stack with a metal layer (130) and an organic layer (120) as first and second outer layers is structured by etching both these outer layers. In one particular embodiment, an additional metal layer (140) may be generated on the outermost metal layer (130) by galvanic growth through a structured isolation 10 layer (150). After removal of said isolation layer (150), the metal (130) may be etched in the openings of the additional metal layer (140). In a further etching step, the organic material (120) may be removed in said openings, too.

17 Claims, 3 Drawing Sheets

(51) Int. Cl.
  *H01L 51/00* (2006.01)
  *H01L 51/44* (2006.01)
  *H01L 51/52* (2006.01)
  *H01L 27/32* (2006.01)

(52) U.S. Cl.
  CPC ...... *H01L 51/5237* (2013.01); *H01L 51/5253* (2013.01); *H01L 27/3276* (2013.01); *H01L 27/3288* (2013.01); *Y02E 10/549* (2013.01); *Y02P 70/521* (2015.11)

(58) Field of Classification Search
  CPC ..... H01L 27/3288; H01L 51/10; H01L 51/52; H01L 51/44; Y02P 70/521; Y02E 10/549
  USPC ..... 438/22–47, 64–99, 127; 257/40, 79–103, 257/E21.038, E33.056
  See application file for complete search history.

(56) References Cited

U.S. PATENT DOCUMENTS

| | | |
|---|---|---|
| 2003/0184217 A1 | 10/2003 | Yamazaki et al. |
| 2004/0219465 A1* | 11/2004 | Meijer et al. ............... 430/322 |
| 2005/0019977 A1* | 1/2005 | Prakash ...................... 438/99 |
| 2007/0176170 A1* | 8/2007 | Ho ........................ H01L 27/322 257/40 |
| 2007/0249122 A1 | 10/2007 | Seo et al. |
| 2008/0142987 A1* | 6/2008 | Seta ................... G06F 17/5077 257/773 |
| 2008/0252205 A1 | 10/2008 | Young et al. |
| 2010/0133572 A1* | 6/2010 | Hirai .............................. 257/98 |
| 2010/0244068 A1* | 9/2010 | van Rens ............ H01L 51/5256 257/98 |
| 2010/0276722 A1* | 11/2010 | Baur ...................... H01L 24/24 257/99 |
| 2011/0121346 A1* | 5/2011 | Yamada .............. H01L 51/5234 257/98 |
| 2011/0146070 A1 | 6/2011 | Fiaccabrino et al. |
| 2011/0303909 A1* | 12/2011 | Chen .................... C07D 333/10 257/40 |

FOREIGN PATENT DOCUMENTS

| | | |
|---|---|---|
| JP | 2007-242436 A | 9/2007 |
| TW | 201027452 A1 | 7/2010 |
| WO | 201102573 A1 | 2/2011 |

OTHER PUBLICATIONS

Tanpo Tetsuya, Fukumoto Shigeru, Yamamoto Hajime, Application, Publication No. 11-312583 (machine translation), Application filed Apr. 27, 1998, 7 pages.

Uchida Masahiro, Application, Publication No. 2007-242436 (machine translation), Application filed Mar. 9, 2006, 14 pages.

* cited by examiner

METHOD FOR MANUFACTURING AN ORGANIC ELECTRONIC DEVICE

FIELD OF THE INVENTION

The invention relates to a method for manufacturing an electronic device comprising at least one organic layer and one metal layer.

BACKGROUND OF THE INVENTION

Electronic devices comprising organic layers are for example known from organic light emitting diodes (OLEDs) or organic photovoltaic cells (OPVC). In such devices, metal lines are typically used to electrically contact the organic material. Generation of these metal lines by micro-structuring of a metal layer is not easy because the nearby organic material is very sensitive to damages from the manufacturing processes. Etching of the outermost metal layer in a trial-production of an OLED display has been described in literature ("Patterning Techniques for Polymer Light-Emitting Diodes", Florian Pschenitzka, Ph. D Thesis submitted to Dept. of Elect. Engg., Princeton Univ., USA., June 2002, pages 145-164), but such a process has not widely been used for an industrial production.

SUMMARY OF THE INVENTION

Based on this background, it was an object of the present invention to provide an improved manufacturing procedure for electronic devices comprising materials that have to be structured, wherein said procedures shall particularly be suited for an application in industrial mass production. Moreover, the structuring should preferably be possible for a wide range of scales, for example allowing precisely removing only very fine areas as well as large area removing.

This object is achieved by a method according to claim 1. Preferred embodiments are disclosed in the dependent claims.

The method according to the present invention relates to the manufacturing of an electronic device and comprises (at least) the following steps, which may be executed in the listed or any other appropriate order:

a) Producing a stack of layers comprising (on one side of the stack) as first and second outer layers a metal layer and an organic layer. In this context, the "first outer layer" shall be the outermost layer of the stack, and the "second outer layer" shall be located immediately beneath this. Preferably, the metal layer is the first outer layer and the organic layer the second outer layer, though the opposite arrangement shall be comprised by the present invention, too.

b) Structuring the aforementioned (first and second) outer layers by etching. The structuring may particularly comprise that the initial uniformity of the layers in their plane of extension is broken, for example by the generation of openings in said plane.

It should be noted that the complete manufacturing of the electronic device will usually imply further, device-specific steps that are irrelevant for the present invention and therefore not listed here.

The described method has the advantage that it does not require the application of masks through which the organic material or the metal of the stack layers is deposited, wherein the handling and alignment of such structured masks is usually very cumbersome. Instead, the structuring of both the organic and the metal layer is achieved by an etching procedure. The etching has the further advantage that it removes metal and organic material from locations where it is not desired without producing any debris (as would be the case if for example a laser ablation would be used for the removal).

Most preferably, the etching that is done to structure the outer layers is a dry etching. In dry etching, the material is typically exposed to a bombardment of ions (usually a plasma of reactive gases). Typical etch gasses are $Cl_2$, $BCl_3$ for the metal etch and $O_2$ plasmas for the organic coating. No liquid is applied, which is advantageous as organic layers are usually very sensitive to liquid, particularly to water.

To achieve the structuring of the outer layers by etching, said etching has to be done in a spatially selective way. One preferred method to achieve this comprises the positioning of a structured protective layer on the first outer layer before the etching. Only those areas of the (first and second) outer layers that are located beneath openings of the protective layer will hence be affected by the etching. After etching has been done, the protective layer may be removed, or it may be left in place and typically be buried beneath subsequent layers in case of a thin film encapsulation.

The aforementioned structured protective layer may for example be deposited on the first outer layer by printing, plotting, evaporation through a mask, sputtering through a mask and/or by any other suitable process that is compatible with the metal layer and the organic layer. If the metal layer is the outermost layer, it protects the organic layer such that the choice of an appropriate deposition procedure for the structured protective layer is less critical.

In a particular embodiment of the invention, the mentioned structured protective layer may comprise a thin film encapsulation material. Typical materials of this kind comprise silicon nitride (SiN), SiON, AlO, SiCN, $Al_2O_3$, $SiO_2$, $TiO_2$, and/or $ZrO_2$ etc. Use of a thin film encapsulation material as a protective layer is particularly advantageous if a thin film encapsulation of the electronic device is intended anyway as a final manufacturing step.

According to another embodiment of the invention, the structured protective layer may comprise an additional metal layer, which typically consists of the same metal as the metal layer in the stack. In this embodiment, the metal layer of the stack is preferably the first outer layer of the stack, which implies that the additional metal layer is deposited directly on top of the stack's metal layer. Etching can then be done uniformly for the complete surface of the device, removing metallic material everywhere at approximately the same rate until the organic layer is reached at the locations where the metal is thinnest, i.e. in openings of the additional metal layer. Here etching stops automatically, and metal will remain only in the areas where the additional metal layer was present. In this embodiment, the metal layer of the stack has primarily the function to protect the organic layer beneath it during the deposition of the structured additional metal layer.

One way to generate the aforementioned additional metal layer is by evaporation and/or sputtering of metal through a mask. Another way comprises two steps: First, a structured isolation layer is deposited on the first outer layer (which is typically the metal layer of the stack). Secondly, the additional metal layer is generated by galvanic growth though the isolation layer. In the second step of galvanic growth, metallic material will be deposited only in the openings of the isolation later. After the completion of the galvanic growth, the isolation layer is preferably removed by some appropriate etching procedure.

As was already indicated above, the electronic device is preferably encapsulated during a further manufacturing step, for example by a thin film encapsulation. With such an encapsulation, the sensitive organic material in the device can be protected from environmental influences.

The organic material of the organic layer in the stack may optionally comprise an organic electroluminescent material. The produced device may then particularly be an OLED, for which the proposed manufacturing procedure is very advantageous as it readily allows the generation of free shapes of the device.

Other particularly suitable embodiments of the electronic device comprise a solar cell or an organic memory.

BRIEF DESCRIPTION OF THE DRAWINGS

These and other aspects of the invention will be apparent from and elucidated with reference to the embodiment(s) described hereinafter. These embodiments will be described by way of example with the help of the accompanying drawings in which.

Like reference numbers or numbers differing by integer multiples of 100 refer in the Figures to identical or similar components.

DESCRIPTION OF PREFERRED EMBODIMENTS

The invention will in the following be described with respect to Organic Light Emitting Diodes (OLEDs) as an example of an electronic device that can be fabricated with the proposed method.

To fabricate a laterally structured OLED, one structured organic mask and one structured metal mask may be used through which the respective materials are applied to a carrier (substrate) beneath. The alignment of these masks is however not trivial, the minimization of structure size is very limited and very cost intensive. Furthermore, structured masks often become instable. If structuring of the organic and/or metal layers is wanted, it may alternatively be done after the deposition of whole (unstructured) layers. Typically laser structuring may then be used to remove the metal and/or organic layers. This process generates however debris which gives difficulties when a thin film encapsulation should be applied on the device afterwards.

In view of this, the present invention proposes a new procedure for manufacturing a structured OLED in which no masks are needed even when lateral structuring is done, no debris is generated, and large process windows are possible (i.e. the process is tolerant against small process variations like temperature variations, mechanical variations of the substrates etc.) as the processes are self-stopping process at the interfaces (inorganic/organic/inorganic). Essential features of a preferred embodiment of the proposed manufacturing method are:

1. Using plasma etching to structure an OLED.
2. Using an etch protection layer to define areas which should not be etched.

The aforementioned etch protection layer can consist of
a thick structured metal layer (FIG. 1-6);
a structured layer of overlying thin film encapsulation (FIG. 7-9);
any structured etch protection layer which does not harm the OLED and protects it during etching.

The aforementioned structured metal layer can for instance be made by:
Using galvanic growth of metal (ionic liquids) in combination with a insulator for the structuring of the grown layer.
Using a thermal evaporation/sputtering process in combination with a shadow mask.

The above mentioned structured etch protection, which can be a part of a thin film encapsulation, can be applied by printing (e.g. ink jet printing, plotting, vacuum plotting), evaporation through a mask, or the like. The thin film encapsulation can for instance comprise polymers like acrylates having no or very low quantities of residual water. Moreover, it can comprise monomers as well, which are then crosslinked on the substrate.

In the following, consecutive steps of a first manufacturing method of an organic semiconductor device according to the present invention will be described with respect to FIGS. 1 to 6.

Figure 1:
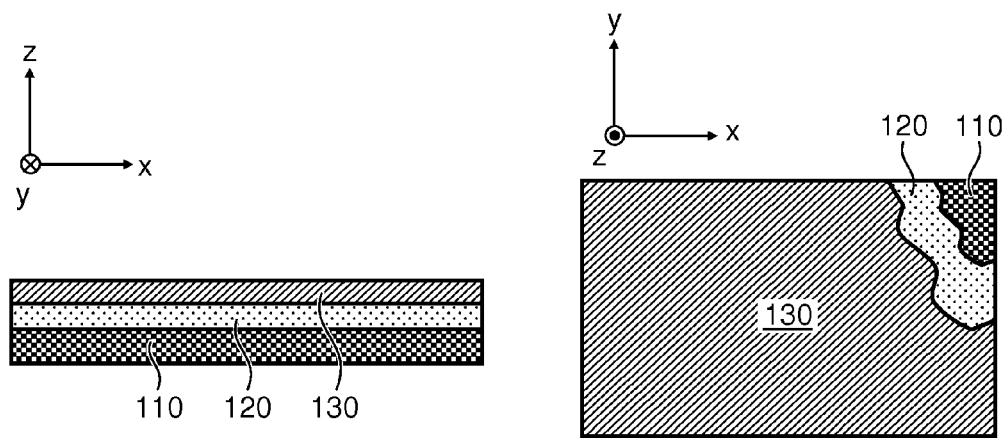
FIGS. 1-6 illustrate consecutive manufacturing steps according to a first embodiment of the present invention, wherein the left part of the drawings shows a schematic section and the right part the corresponding top view of the respective intermediate workpiece.

FIG. 1 illustrates the starting point, in which first an electroluminescent organic layer 120 ("second outer layer") and then a metal layer 130 ("first outer layer") are evaporated onto a substrate 110 without structuring to produce a uniform stack of layers (wherein said substrate typically comprises a conductive layer on top, e.g. an ITO layer, which is not shown in detail here). The metal layer 130 will usually be operated as a cathode in the final device.

Figure 2:
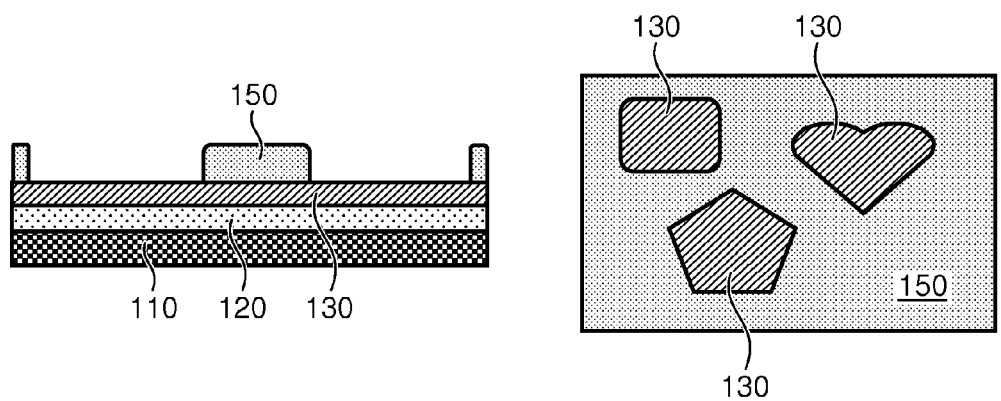

FIG. 2 shows the next step, in which a structured resist/insulator layer 150 is printed onto the metal layer 130 of the device as an "isolation layer". The openings of this isolation layer 150 can be arbitrarily shaped, allowing to produce free-shape OLEDs.

Figure 3:
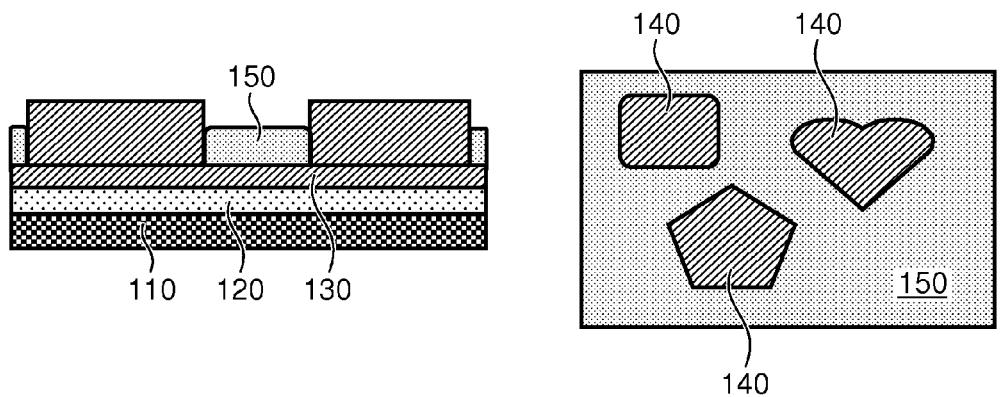

FIG. 3 shows the subsequent galvanic plating step that is used to apply an additional metal layer 140 to thicken the cathode 130 in the areas which are not covered by the isolation layer 150. The material of this additional metal layer 140 will typically be the same metal as that of the cathode 130, for example aluminum.

Figure 4:
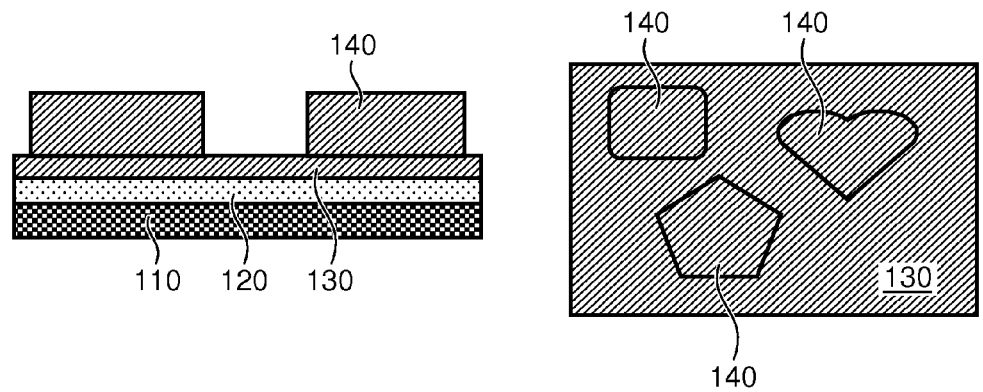

FIG. 4 shows the next step, in which the insulator layer 150 is removed by plasma etching.

Figure 5:
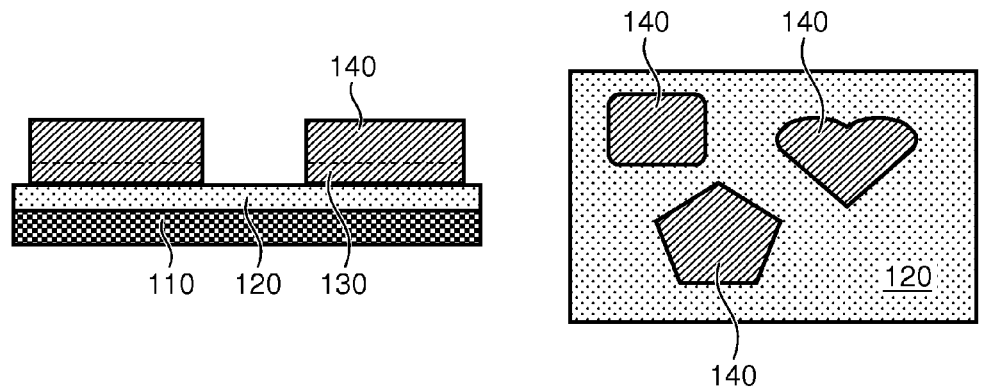

In FIG. 5, the following (full area) etching of the metal is shown. Due to the thickness variations of the metal (layers 130, 140), the areas where the resist 150 was present during the plating step (i.e. the openings of the additional metal layer 140) are etched away first. The etching process in these areas stops when the organic layer 120 is reached. The original border between the unstructured metal layer 130 and the additional metal layer 140 is indicated by dotted lines.

Figure 6:
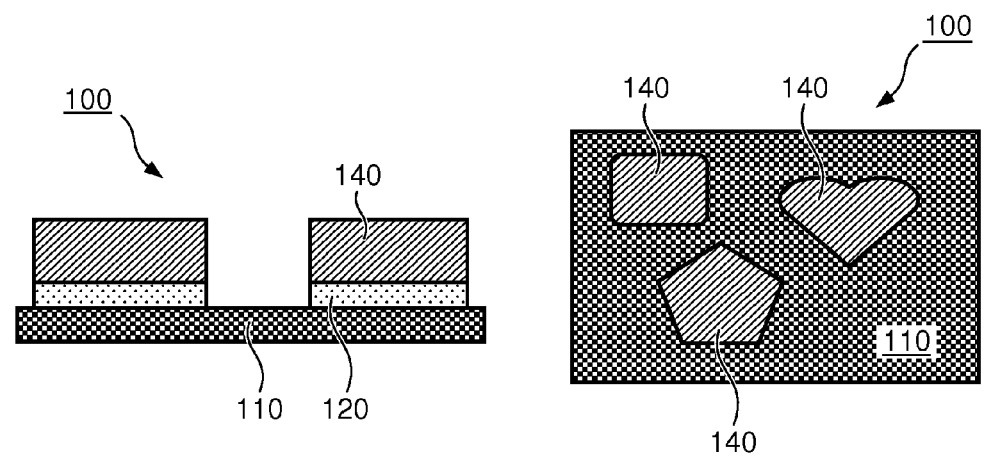

FIG. 6 shows the next step, which is a dry etch process of the organic layer 120. Areas which should not be etched are covered with metal, therefore the organic semiconductor device (here the finally produced OLED 100) is protected.

In the processing steps of FIGS. 5 and 6, the additional metal layer 140 functions as a structured protective layer for the etching of the layers beneath it. The described process can for example be used for drilling vias into an OLED, separating OLEDs from each other, or the like.

Figure 7:
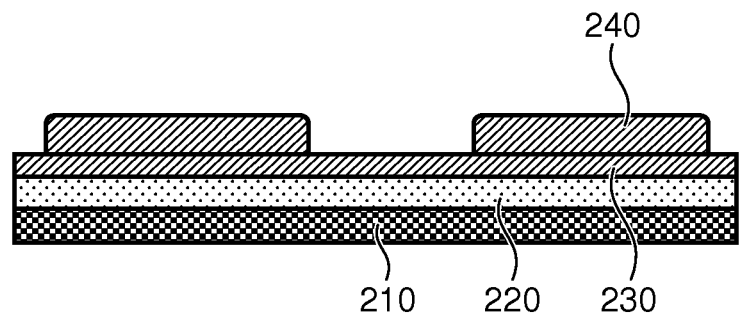
FIGS. 7-9 illustrate consecutive manufacturing steps according to a second method of the present invention in a schematic side view.
Figure 8:
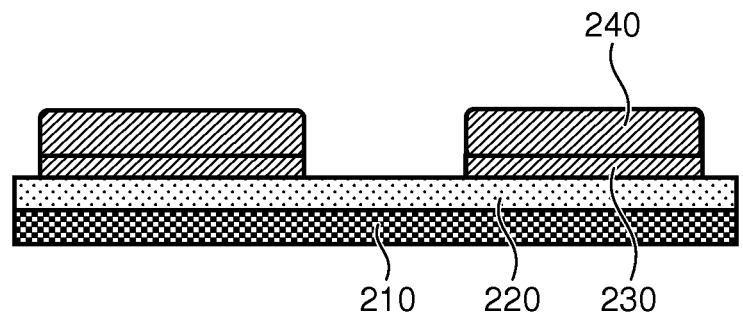
Figure 9:
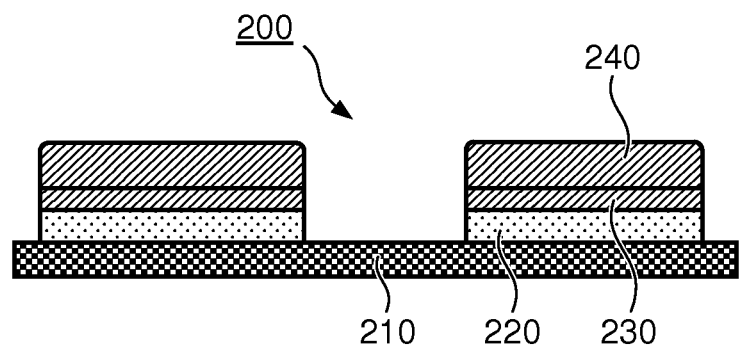

FIGS. 7 to 9 illustrate an alternative manufacturing process of an OLED 200. As above, this process starts from a stack of a substrate 210, an electroluminescent organic layer 220, and a metal layer (cathode) 230.

According to FIG. 7, an organic thin film encapsulation material is then deposited on the outermost metal layer 230, yielding a structured protective layer 240. The material of this layer may for example comprise an organic coating for planarization to cover pinholes in the barrier layer(s).

Next, the metal layer 230 (FIG. 8) and the organic layer 220 (FIG. 9) are dry etched through the openings of the structured protective layer 240, yielding the desired laterally structured OLED device 200.

In summary, the above examples demonstrate the possibility of structuring an OLED or other organic semiconductor devices by using a lithography-free dry etch step. The dry etch step is superior to laser ablation steps, because no debris is generated. Therefore a thin film encapsulation of the device is still possible after structuring. The disclosed procedures can for example also be applied for the production of solar cells or organic memories.

Finally it is pointed out that in the present application the term "comprising" does not exclude other elements or steps, that "a" or "an" does not exclude a plurality, and that a single processor or other unit may fulfill the functions of several means. The invention resides in each and every novel characteristic feature and each and every combination of characteristic features. Moreover, reference signs in the claims shall not be construed as limiting their scope.

The invention claimed is:

1. A method for manufacturing an electronic device, said method comprising:
   producing a stack of layers comprising as first and second outer layers a metal layer as the first outer layer and an organic layer;
   depositing a structured protective layer on the first outer layer, the structured protective layer comprising an additional metal layer; and
   structuring, after depositing the structured protective layer, said outer layers by etching, wherein the etching comprises a dry etching.

2. The method according to claim 1, wherein the structured protective layer comprising an additional metal layer is generated by evaporation and/or sputtering through a mask.

3. The method according to claim 1, wherein a structured isolation layer is deposited on the first outer layer and the additional metal layer is generated by galvanic growth through the isolation layer.

4. The method according to claim 1, wherein the electronic device is encapsulated.

5. The method according to claim 1, wherein the organic layer comprises an organic electroluminescent material.

6. The method according to claim 1, wherein the electronic device is an OLED, an organic solar cell, or an organic memory.

7. The method according to claim 1, wherein the structuring comprises removing one or more portions of said metal layer of said stack of layers by etching through said metal layer of said stack of layers.

8. The method according to claim 7, wherein said additional metal layer is partially etched due to said etching through said metal layer of said stack of layers.

9. The method according to claim 7, wherein at least one second portion of said metal layer of said stack of layers that is different from said one or more portions of said metal layer is unetched by said etching through said metal layer and wherein said additional metal layer is partially etched in at least one region of said additional metal layer that is perpendicularly above said at least one second portion due to said etching through said metal layer of said stack of layers.

10. The method according to claim 9, wherein, prior to said etching through said metal layer, a combined thickness of said metal layer of said stack of layers and said additional metal layer at said at least one second portion of said metal layer is greater than a combined thickness of said metal layer of said stack of layers and said additional metal layer at said one or more portions of said metal layer.

11. The method according to claim 8, wherein the depositing is performed such that the one or more portions of said metal layer is uncovered by said additional metal layer.

12. The method according to claim 1, wherin the structured protective layer is the same metal as the first outer metal layer.

13. The method according to claim 1 wherein the first outer layer is a cathode.

14. The method according to claim 13 where the first outer layer comprises aluminum.

15. The method of claim 1 where the first outer layer is unstructured.

16. The method of claim 1 where the first and second outer layers are unstructured.

17. The method of claim 1 wherein the structured protective layer includes openings.

\* \* \* \* \*